(12) United States Patent
Yoshizawa

(10) Patent No.: US 6,696,828 B2
(45) Date of Patent: Feb. 24, 2004

(54) INTEGRATED CIRCUIT AND LOT SELECTION SYSTEM THEREFOR

(75) Inventor: Akihiko Yoshizawa, Kanagawa-ken (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 361 days.

(21) Appl. No.: 09/725,058

(22) Filed: Nov. 29, 2000

(65) Prior Publication Data

US 2001/0006343 A1 Jul. 5, 2001

(30) Foreign Application Priority Data

Nov. 30, 1999 (JP) .......................... P11-341041

(51) Int. Cl.⁷ .................... G01R 23/12; G01R 23/20; H03D 13/00
(52) U.S. Cl. ............... 324/76.53; 324/76.77; 324/622
(58) Field of Search .................... 324/76.53, 76.52, 324/76.55, 76.82, 76.83, 613, 620, 622, 76.77; 375/376

(56) References Cited

U.S. PATENT DOCUMENTS

| | | | |
|---|---|---|---|
| 4,862,485 A | 8/1989 | Guinea et al. | |
| 5,180,971 A | * 1/1993 | Montijo | 324/121 R |
| 5,295,079 A | 3/1994 | Wong et al. | |
| 5,594,391 A | 1/1997 | Yoshizawa | |
| 5,682,112 A | 10/1997 | Fukushima | |
| 5,909,474 A | 6/1999 | Yoshizawa | |
| 6,003,142 A | * 12/1999 | Mori | 714/30 |
| 6,011,444 A | 1/2000 | Takada et al. | |
| 6,016,080 A | * 1/2000 | Zuta et al. | 331/25 |
| 6,163,186 A | * 12/2000 | Kurita | 327/157 |
| 6,323,738 B1 | 11/2001 | Yoshizawa et al. | |
| 6,396,889 B1 | * 5/2002 | Sunter et al. | 375/376 |

* cited by examiner

*Primary Examiner*—Anjan K. Deb
(74) *Attorney, Agent, or Firm*—Oblon, Spivak, McClelland, Maier & Neustadt, P.C.

(57) ABSTRACT

An integrated circuit for testing a PLL circuit that includes a phase error generator to receive a signal gained by dividing an oscillated signal from a voltage controlled oscillator and a reference signal so as to detect a phase error signal between the both, an integrating circuit to integrate error signals outputted by the phase error generation circuit, a reference voltage generator to generate a predetermined reference voltage, and a comparator configured to compare an integration result voltage outputted from the integrating circuit with a reference voltage generated by the reference voltage generation circuit, wherein the reference voltage generator and the comparison circuit is configured electrically outside of a loop in the PLL circuit.

9 Claims, 11 Drawing Sheets

INTEGRATED CIRCUIT AND LOT SELECTION SYSTEM THEREFOR

CROSS REFERENCE TO RELATED APPLICATIONS

The subject application is related to subject matter disclosed in the Japanese Patent Application No. Hei11-341041 filed in Nov. 30, 1999 in Japan, to which the subject application claims priority under the Paris Convention and which is incorporated by reference herein.

BACKGROUND OF THE INVENTION

1. Field of the Invention

The present invention relates to an integrated circuit loaded with phase locked loop (PLL) circuit and a lot selection system for selecting good products and bad products of the integrated circuits, and more particularly to a test circuit for testing the characteristic of the PLL circuit.

2. Description of the Related Art

Recently, in the PLL circuit, a frequency generated with respect to a reference frequency has been demanded to have a highly stable characteristic having a low jitter. For the reason, good products and bad products of the PLL circuits are selected by measuring the jitter of the frequency generated by the PLL circuit using a test circuit at a high precision.

Figure 1:
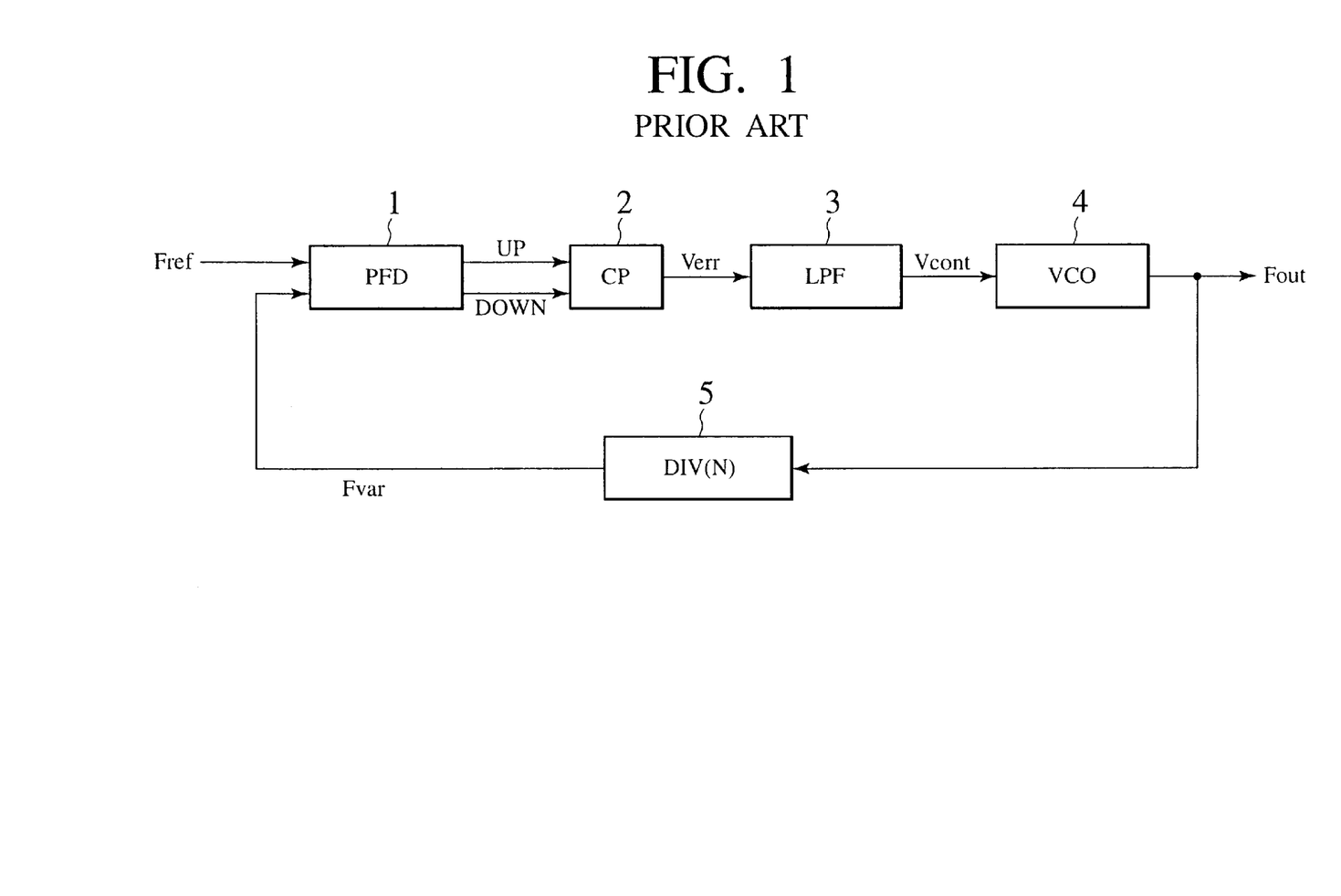
FIG. 1 is a block diagram showing an example of the structure of a conventional PLL circuit.

FIG. 1 is a block diagram showing an example of the structure of a basic PLL circuit based on conventional technology.

A reference signal Fref having a reference frequency is inputted to one input terminal of a phase comparator (hereinafter referred to as PFD) 1 in this PLL circuit. The other input terminal receives a dividing signal Fvar of a frequency (Fout/N) gained by dividing an output signal Fout of a frequency oscillated by a voltage control oscillator (hereinafter referred to as VCO) 4 by N using divider (DIV). Here, the PFD1 outputs UP signal and DOWN signal depending on a differential of phase between the frequency Fout/N and the reference frequency Fref.

The UP signal and the DOWN signal outputted from the PFD 1 are inputted to a charge pump (CP) circuit 2. While the UP signal is being outputted, the CP circuit 2 outputs a high level. While the DOWN signal is being outputted, the CP circuit 2 outputs a low level.

Here, if the frequency Fout/N is lower than the Fref or is delayed in terms of phase, the PFD1 outputs the UP signal only during that delay period. Then, the CP circuit 2 to which the UP signal is inputted outputs a high level. This high level pulse is integrated by a low-pass filter (hereinafter referred to as LPF) 3 to be converted to DC level.

If the LPF3 is a passive filter comprised of resistance and capacitance, an output level of the LPF3 becomes higher than a previous state. As a result, the VCO4 oscillates at a higher frequency than a previous oscillation frequency. If this Fout/N is still lower than the Fref, the VCO4 oscillates at a higher frequency through the same process.

As a result, if the Fout/N becomes higher than the Fref, conversely, the PFD1 outputs the DOWN signal only during the same period. Then, the CP circuit 2 to which the DOWN signal is inputted outputs a low level. This low level pulse is integrated by the LPF3 to be converted to DC level. Then, the output level of the LPF3 becomes lower than its previous state. As a result, the VCO4 oscillates at a frequency lower than the previous oscillation frequency. The Fout/N and Fref are compared to each other in this way several times, so that a loop for eliminating phase error is actuated. Finally, phase differential between the Fout/N and the Fref becomes 0. Consequently, the PFD1 outputs no UP signal or DOWN signal. Then, an output of the CP circuit 2 to which no UP signal or DOWN signal is inputted becomes high impedance so that the output level of the LPF3 is maintained at the same level as the previous state. As a result, the VCO4 maintains the same frequency as the previous oscillation frequency.

The output frequency (Fout) of the PLL is determined depending on the reference frequency (Fref) and the dividing frequency (N) of the divider, so that Fout=Fref×N is established. Thus, the output frequency (Fout) is converted to a frequency gained by multiplying the reference frequency (Fref) with N.

If disturbance such as noise is applied to the PLL circuit, a generated output frequency undergoes a frequency deviation depending on power of the disturbance. The deviated output frequency returns to its original frequency by feedback control of the PLL circuit.

However, if the disturbance is generated cyclically, the generated output frequency is deviated repeatedly. If other defect than the disturbance occurs in a loop of the PLL circuit due to a problem on processing also, the generated output frequency may be deviated cyclically because the deviation of the loop response damages stability of the loop response. The amount of the deviation of the output frequency is called jitter, which is an important factor for indicating the performance of the PLL circuit.

Therefore, if an especially high precision jitter performance of a product is demanded or the jitter performance does not secure a sufficient margin with respect to its requested performance, it is necessary to measure the jitter value and determine whether the product is good or wrong. Usually when measuring the jitter value of the output frequency of the PLL or the like, a specialized, high precision measuring device such as a time interval analyzer is used.

Technical field to which the test circuit for the aforementioned PLL circuit is applied covers attached circuit of the PLL circuit used for generating a high frequency clock for internal clock of LSI such as micro computer (MCU), digital signal processor (DSP) and the like. The PLL technology uses a low frequency clock for external clock of the LSI and a high frequency clock for internal clock of the LSI, so that this is employed in applied field for improving the processing performance of the LSI, suppressing power of the entire system and the like.

Because such a specialized, high precision measuring device as a time interval analyzer is expensive and takes a long time for measurement, if this is employed for mass production of the LSI or the like, there is an increase of test cost. Further, because the PLL circuit is very likely to be affected by disturbance such as noise, measuring substrate and measuring environment need to be adjusted, thereby making it difficult to measure the jitter value of the PLL circuit at a high precision. Thus, it is difficult to measure the jitter value of the PLL loaded on the integrated circuit and select good products and bad products quickly.

The PLL circuit has a following performance as well as the jitter performance. That is, there is a fear that if the duty value of the output signal is not 50%, processing to be carried out synchronously with a period in which the duty value is less than 50% may not be executed because of shortage of time. For this reason, there has been demanded a PLL circuit in which the duty value of an output signal thereof satisfies 50% by measuring how the duty value of the output signal is deviated from 50%. However, such a measurement has not been achieved yet.

SUMMARY OF THE INVENTION

The present invention has been achieved to solve the above described problem and an object of the invention is to provide an integrated circuit which allows to determine whether it is a good or bad product by measuring the jitter value of the PLL circuit without inducing an increase of test cost and allows to measure the duty value error of the PLL circuit.

Another object of the present invention is to provide a lot selection system capable of automatically selecting whether an integrated circuit incorporating the PLL circuit is good or bad.

To achieve the above object, a first feature of they integrated circuit of the present invention includes: a phase error generation circuit for receiving a signal gained by dividing an oscillated signal from a voltage controlled oscillator and a reference signal so as to detect a phase error signal between the both; an integrating circuit for integrating error signals outputted by the phase error generation circuit; a reference voltage generation circuit for generating a predetermined reference voltage; and a voltage comparison circuit for comparing an integration result voltage outputted from the integrating circuit with a reference voltage generated by the reference voltage generation circuit.

A second feature of the integrated circuit of the present invention includes: first integrating circuit for receiving a normal turn signal of an oscillated signal from a voltage controlled oscillator and integrating it; a second integrating circuit for receiving an inverted, signal of the oscillated signal and integrating it; a subtraction circuit for obtaining a differential between integration result voltages outputted from the first and second integrating circuits.

A third feature of the integrated circuit of the present invention includes: a first integrating circuit for receiving a normal turn signal of an oscillated signal from a voltage controlled oscillator and integrating it; a second integrating circuit for receiving an inverted signal of the oscillated signal and integrating it; a subtraction circuit for obtaining a differential between integration result voltages outputted from the first and second integrating circuits; a reference voltage generation circuit for generating a reference voltage higher and a reference voltage lower than a predetermined intermediate potential; a first voltage comparison circuit for comparing a differential voltage outputted from the subtraction circuit with a higher reference voltage generated by the reference voltage generation circuit; a second voltage comparison circuit for comparing a differential voltage outputted from the subtraction circuit with a lower reference voltage generated by the reference voltage generation circuit; and a logical OR circuit for implementing logical OR of comparison results outputted from the first and second voltage comparison circuits.

Because usually, the PLL circuit carries out feedback control so as to reduce a phase error between both the reference signal and the signal gained by dividing the output signal from the voltage controlled oscillator, according to the integrated circuit of the present invention, the phase error decreases if the jitter value is small. Therefore, the integrated voltage Verr of the phase error generated by integrating the phase error signals also decreases. Conversely, if the jitter value is large, the phase error between both the reference signal and the signal Fvar gained by dividing the output signal from VCO increases. Thus, the integrated voltage Verr of the phase error generated by integrating the phase error signal also increases. For this reason, the jitter value can be evaluated easily by integrating the phase error signal in time axis direction so as to convert to the voltage value Verr and then comparing this voltage value with the reference value, although indirectly.

A first feature of the lot, selection system of the present invention includes: a phase error generation circuit for receiving a signal gained by dividing an oscillated signal from a voltage controlled oscillator and a reference signal so as to detect a phase error signal between the both; an integrating circuit for integrating error signals outputted by the phase error generation circuit; a reference voltage generation circuit for generating a predetermined reference voltage; a voltage comparison circuit for comparing an integration result voltage outputted from the integrating circuit with a reference voltage generated by the reference voltage generation circuit; a determining circuit for determining whether a LSL chip containing the respective circuits is good or wrong depending on a comparison result outputted from the voltage comparison circuit; and a lot selector for selecting the LSJ chip depending on a determination result of the determining circuit.

A second feature of the lot selection system of the present invention includes: a first integrating circuit for receiving a normal turn signal of an oscillated signal from a voltage controlled oscillator and integrating it; a second integrating circuit for receiving an inverted signal of the oscillated signal and integrating it; a subtraction circuit for obtaining a differential between integration result voltages outputted from the first and second integrating circuits; a reference voltage generation circuit for generating a reference voltage higher and a reference voltage lower than a predetermined intermediate potential; a first voltage comparison circuit for comparing a differential voltage outputted from the subtraction circuit with a higher reference voltage generated by the reference voltage generation circuit; a second voltage comparison circuit for comparing a differential voltage outputted from the subtraction circuit with a lower reference voltage generated by the reference voltage generation circuit; and a logical OR circuit for implementing logical OR of comparison results outputted from the first and second voltage comparison circuits; a determining circuit for determining whether a LSI chip containing the respective circuits is good or bad depending on a comparison result outputted from the logical OR circuit; and a lot selector for selecting the LSI chip depending on a determination result of the determining circuit.

The lot selection system of the present invention incorporates a test circuit for measuring the jitter value of the PLL circuit to indicate good product or bad product, on a LSI chip. Thus, an automatic selection system capable of selecting a good product or bad product depending on the magnitude of the jitter value can be built with a very simple structure, so that productivity of the integrated circuit and quality control thereof can be improved tremendously.

Other and further objects and features of the present invention will become obvious upon understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE PREFERRED EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 2:
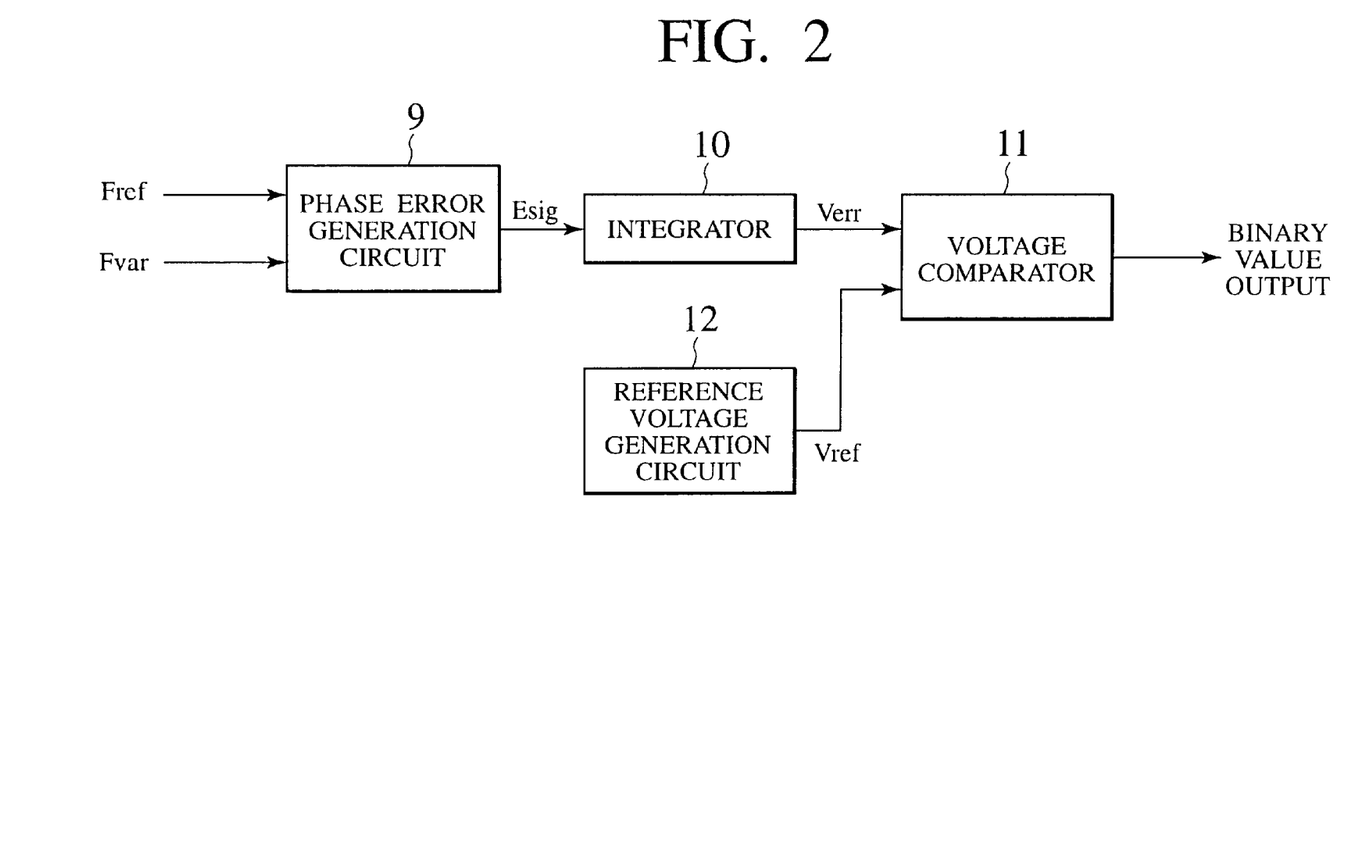
FIG. 2 is a block diagram showing a structure of a first embodiment of a test circuit provided on an integrated circuit of the present invention.

FIG. 2 is a block diagram showing the first embodiment of a test circuit loaded on the integrated circuit of the present invention.

The test circuit according to the first embodiment comprises a phase error generation circuit 9 for generating a phase error signal Esig by receiving a reference signal Fref from a PLL circuit (not shown) loaded on the integrated circuit of the present invention and a signal Fvar gained by dividing an output signal from the VCO to obtain a phase error between the two, an integrator 10 for generating an integrated voltage Verr of the phase error by integrating the generated phase error signal Esig, a voltage comparator 11 for receiving the integrated voltage Verr of the phase error with the reference voltage Vref to compare the two and a reference voltage generation circuit 12 for generating the reference voltage Vref and supplying it to the voltage comparator 11.

Meanwhile the reference signal Fref and the dividing signal Fvar are the reference signal Fref and the dividing signal Fvar in the PLL circuit (not shown) loaded on the integrated circuit shown in FIG. 1.

Next, an operation of the test circuit according to the first embodiment will be described.

The test circuit of the first embodiment measures a basic jitter value of the PLL circuit loaded on the same integrated circuit. The phase error generation circuit 9 receives the reference signal Fref and the dividing signal Fvar so as to obtain a phase error between the two and generate a phase error signal Esig and then outputs this phase error signal Esig to an integrator 10. The integrator 10 integrates generated phase error signals Esig, generates an integrated voltage Verr corresponding to the aforementioned phase error and outputs this to a voltage comparator 11. The voltage comparator 11 compares the integrated voltage Verr inputted with the reference voltage Vref. If the integrated voltage Verr is higher than the reference voltage Vref, high level ("1") is outputted and if the integrated voltage Verr is lower than the reference voltage Vref, low level ("0") is outputted.

Here, usually, the PLL circuit operates a feedback control to minimize a phase error between the reference signal Fref and the signal Fvar gained by dividing the output signal from the VCO. Thus, if the jitter value is small, the phase error between the two decreases. Therefore, the integrated voltage Verr of the phase error generated by integrating the phase error signals also decreases.

Conversely, if the jitter value is large, the phase error between the reference signal Fref and the signal Fvar gained by dividing the output signal from the VCO increases. Therefore, the integrated voltage Verr of the phase error generated by integrating the phase error signals also increases. Thus, the phase error signal Esig in the time axis direction is converted to the voltage value Verr, so that the jitter value can be evaluated easily based on this voltage value although indirectly.

That is, if the integrated voltage Verr outputted from the integrator 10 is small, the jitter value of the PLL circuit can be determined to be small. If the integrated voltage Verr is large, the jitter value of the PLL circuit can be determined to be large. Then, if the reference voltage to be inputted to the voltage comparator 11 is set to an appropriate value in order to distinguish between a good product whose jitter value is small and a bad product whose jitter value is large, when the output 1 from the voltage comparator 11 is high level ("1"), that product is determined to be a bad product and when low level ("0"), it is determined to be a good product.

According to this embodiment, the test circuit is loaded on the integrated circuit containing the PLL circuit, and whether a product is a good product whose jitter value in the PLL circuit of the integrated circuit is small or a bad product whose jitter value in the PLL circuit of the integrated circuit is large can be determined easily and quickly according to binary signal outputted from that test circuit.

By incorporating the test circuit for measuring the jitter value of the PLL circuit on the LSI chip (integrated circuit), the measuring time can be reduced and the necessity of expensive measuring device is eliminated, although chip cost may be increased to some extent due to that additional circuit, so that test cost can be reduced largely.

This also contributes to improvement of through-put and reduction of total chip cost. Further, by incorporating the test circuit on the LSI chip, it becomes unlikely to be affected by disturbance such as noise from a measuring environment, so that adjustment of a measuring board and measuring environment is facilitated.

Next, a structure and an operation of the phase error generation circuit shown in FIG. 2 will be described.

FIG. 3 is a circuit diagram showing the structure of the first embodiment of the phase error generation circuit shown in FIG. 2 and a waveform diagram showing an operation timing.

Figure 3A:
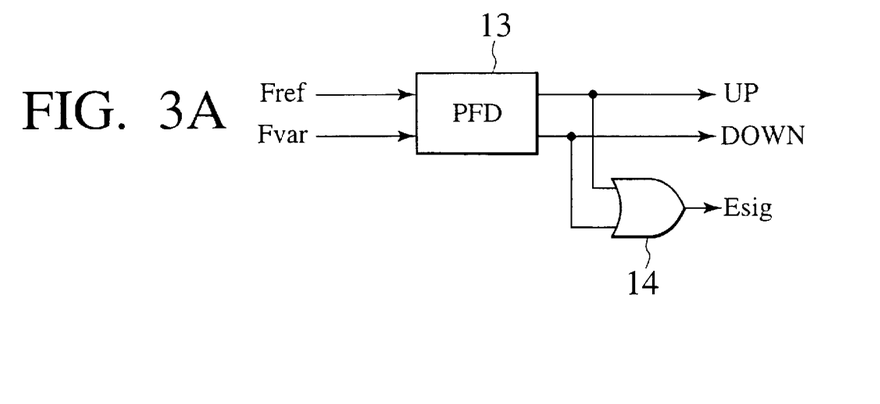
FIG. 3 is a circuit diagram showing the structure of the first embodiment of the phase error generating circuit shown in FIG. 2 and a waveform diagram showing an operation timing.

The phase error generation circuit comprises a phase comparator (PFD) 13 and an OR circuit 14 as shown in FIG. 3A.

Figure 3B:
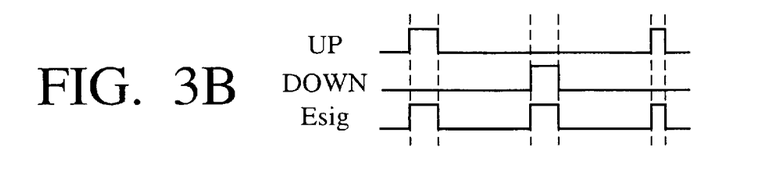

As the phase comparator 13, a phase comparator used in the PLL circuit is used. The reference signal Fref and the signal Fvar gained by dividing an output frequency from the VCO are inputted to the phase comparator 13, which outputs the UP signal and DOWN signal, which are the phase error signal between the both signals. An OR circuit 14 implements OR of the UP signal and the DOWN signal outputted from the phase comparator 13 as shown in FIG. 3B and outputs the obtained signal as a phase error signal Esig as shown in FIG. 3B. Therefore, the phase error generating device is comprised substantially of only the OR circuit 14 for two inputs.

FIG. 4 is a circuit diagram showing the structure of the second embodiment of the phase error generation circuit shown in FIG. 2 and a waveform diagram showing an operating timing.

Figure 4A:
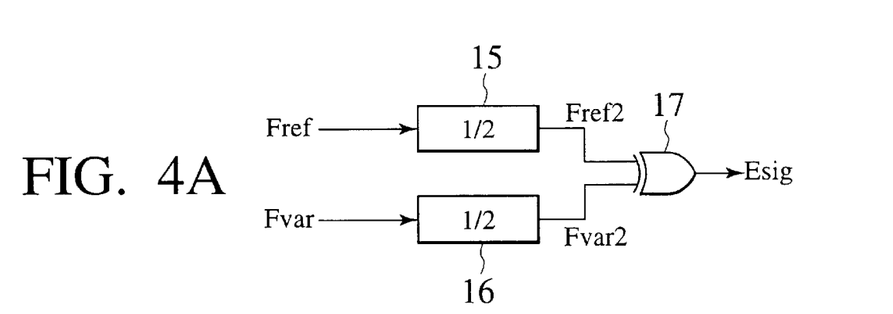
FIG. 4 is a circuit diagram showing a structure of a second embodiment of the phase error generating circuit shown in FIG. 2 and a waveform diagram showing an operation timing.

The phase error generation circuit comprises 1/2 dividing circuits 15, 16 and exclusive OR circuit (EX-OR) circuit 17 as shown in FIG. 4A.

Figure 4B:
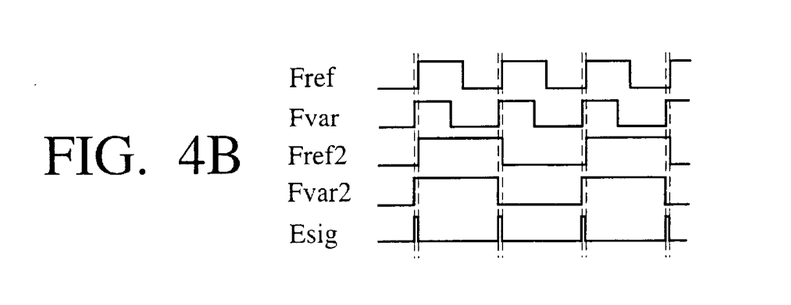

As shown in FIG. 4B, the reference signal Fref and the signal Fvar gained by dividing the output frequency of the VCO are divided by ½ by the ½ dividing circuits 15, 16 so as to be converted to Fref2 and Fvar2 respectively so that the waveform is shaped to a waveform whose duty value is 50%. The EX-OR circuit 17 implements exclusive OR (EX-OR) of signals gained by dividing the reference frequency whose waveform is shaped and the output frequency of the VCO whose waveform is shaped and a result thereof is outputted as the phase error signal Esig.

Figure 5:
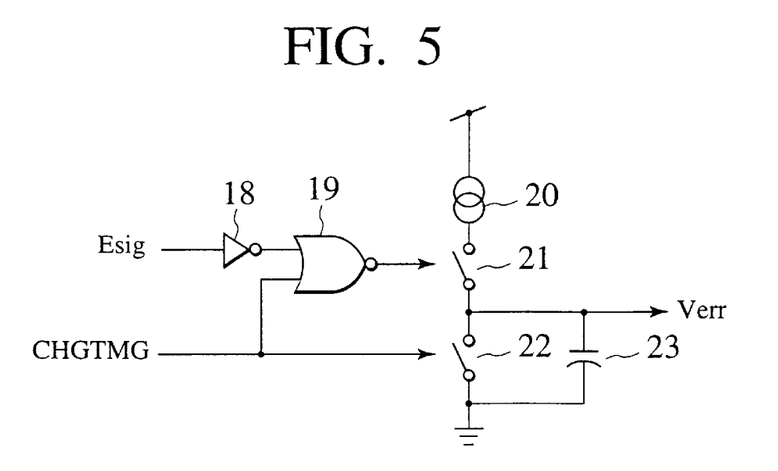
FIG. 5 is a circuit diagram showing a structure of the first embodiment of the integrator shown in FIG. 2.

FIG. 5 is a circuit diagram showing the structure of the first embodiment of the integrator shown in FIG. 2.

The integrator comprises an inverter 18 for inverting the polarity of the phase error signal Esig, a NOR circuit 19 for implementing NOR of a signal gained by inverting the polarity of the phase error signal Esig and control signal CHGTMG for controlling an integration period, a constant current source 20 whose one terminal is connected to a power voltage, an accumulation switch circuit 21 placed between the constant current source 20 and an output terminal and controlled by NOR output from the NOR circuit 19, a discharge switch circuit 22 placed between the output terminal and a grounding potential and controlled by the control signal CHGTMG and capacitive element 23 connected between the output terminal and the grounding potential.

Figure 7A:
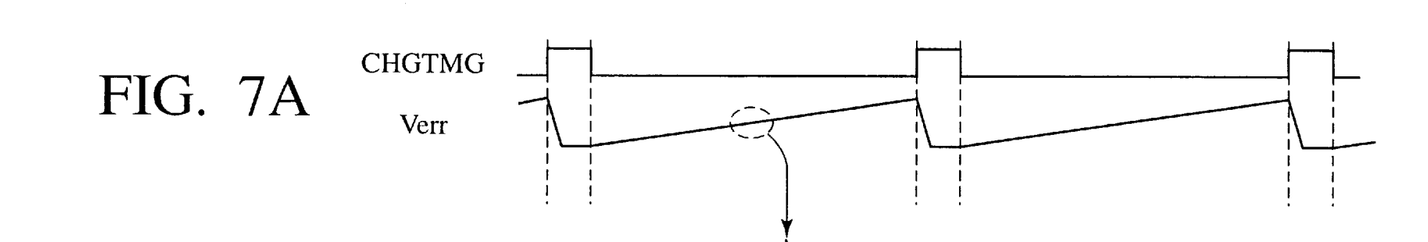
FIG. 7 is a waveform diagram for explaining an operation of the integrator shown in FIG. 5.

An operation of the aforementioned integrator is carried out at a timing shown in FIG. 7. That is, if the control signal CHGTMG becomes high level as shown in FIG. 7A, the accumulation switch circuit 21 is turned OFF so that NOR output becomes high level and then the discharge switch circuit 21 is turned ON. Electric charge accumulated in the capacitive element 23 is discharged by the discharge switch circuit 21, so that the potential of the output voltage Verr becomes the grounding potential.

Figure 7B:
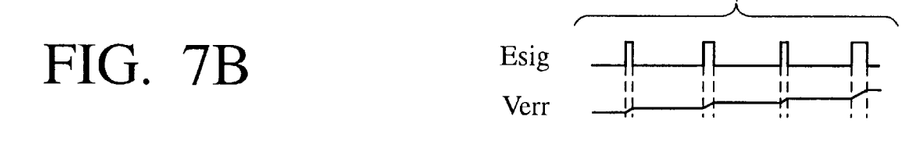

Next, if the control signal CHGTMG becomes low level, the accumulation switch circuit 21 is turned ON when the phase error signal Esig is of high level, so that the discharge switch circuit 22 is turned OFF. Then, if electric charge is accumulated in the capacitive element 23 through the accumulation switch circuit 21, the potential of the output voltage Verr increases gradually. FIG. 7B is an enlarged diagram showing a waveform of the output voltage Verr at a certain point of time and the phase error signal Esing at that time.

The potential of the output voltage Verr depends on a time when the phase error signal Esig is of high level. If the high level time is long, the potential rises steeply. If that time is short, it rises slowly. Then, the high level time of the phase error signal Esig depends on a phase error between the reference signal Fref and the signal Fvar gained by dividing the output frequency of the VCO, that is, the jitter value.

Therefore, if the output voltage is observed in a certain period of time since fall of the control signal CHGTMG, the output voltage increases as the jitter value increases. If the output voltage is measured, the jitter value can be estimated. In this case, it is necessary to measure a correlation between the jitter value and the output voltage preliminarily.

Figure 7C:
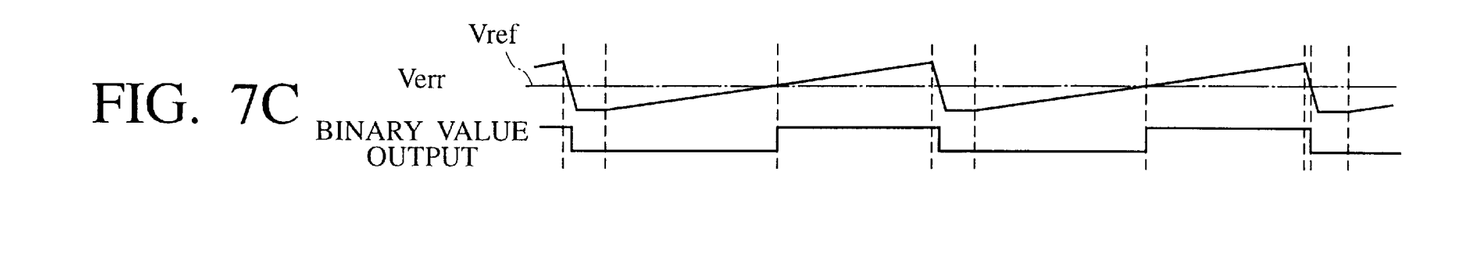

Next, if a binary output of the output voltage is observed in a certain period of time since fall of the control signal CHGTMG as shown in FIG. 7C, if the jitter value is large, a high level output is produced and if the jitter value is small, a low level output is produced. In this case, a time from rise of the control signal CHGTMG to measurement of the high level output depends on the jitter value. Then, by measuring that time, the jitter value can be estimated. In this case, a correlation between the jitter value and that time needs to be measured preliminarily.

When a measurement time is set in time corresponding to the jitter value on specification, if the binary output of the output is of high level at the set measurement time, the jitter value is considered to be larger than that on the specification. Therefore, whether the jitter value is smaller or larger than that on the specification can be determined depending on whether the binary output of the output is of low level or high level at the set measurement time. That is, whether the integrated circuit containing the PLL circuit is a good product or a wrong product can be determined easily.

Figure 6:
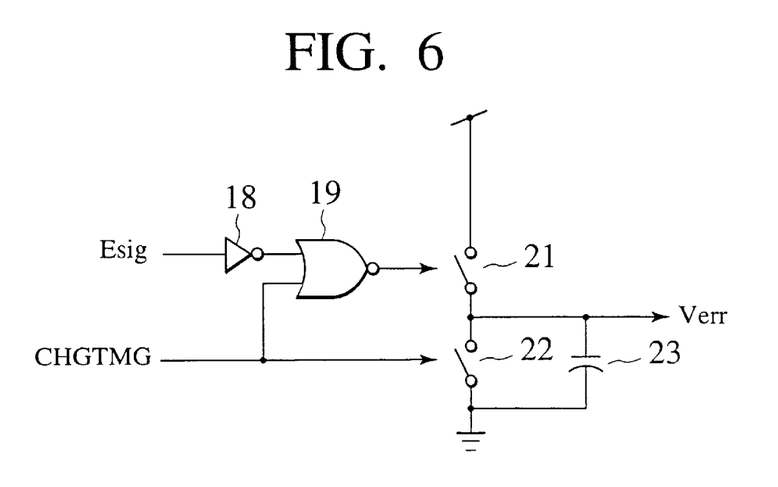
FIG. 6 is a circuit diagram showing a structure of the second embodiment of the integrator shown in FIG. 2.

FIG. 6 is a circuit diagram showing the structure of the second embodiment of the integrator shown in FIG. 2.

This integrator is the same as a circuit shown in FIG. 5 except that the power voltage is connected directly to a terminal of the accumulation switch circuit 21 and conducts the same operation.

Figure 8:
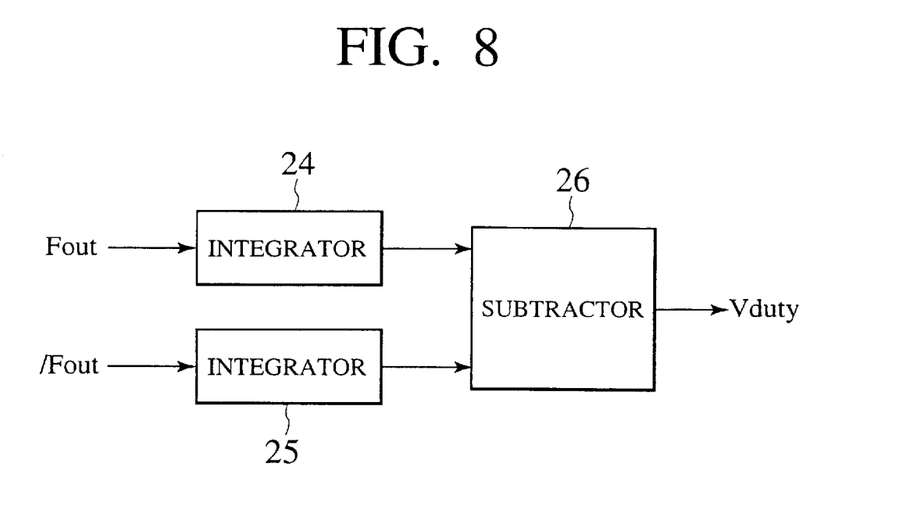
FIG. 8 is a block diagram showing a structure of the first embodiment of a test circuit for measuring basic duty values loaded on the integrated circuit of the present invention.

FIG. 8 is a block diagram showing the structure of the first embodiment concerning a test circuit for measuring a duty value of the PLL circuit loaded on the integrated circuit of the present invention.

The test circuit of this embodiment comprises an integrator 24 for integrating normal turn signals Fout of the output signal from the VCO of the PLL circuit, an integrator 25 for integrating inverted signal/Fout of the aforementioned output signal and a subtractor 26 for subtracting integrated values of the integrators 24, 25.

Next, an operation of the test circuit of this embodiment will be described.

The integrators 24, 25 integrate the normal turn signal FOUT and inverted signal/FOUT of the output signal from the VCO separately and then, input signals having that integration result to the subtractor 26. The subtractor 26 obtains a differential between the output signals from the integrators 24 and 25 and outputs its result as output voltage Vduty.

Because the integrators 24, 25 accumulate electric charge in the waveforms of the normal turn signal FOUT and inverted signal/FOUT in a period of high level, the output voltage Vduty increases. Then, electric charge is released in a period of low level so that the output voltage Vduty drops.

For example if the output signals from the integrators 24, 25 are of the same level, the differential between the output signals is zero, so that the output of the subtractor 26 becomes intermediate potential (potential half of the power voltage and grounding potential). This indicates that the duty value of the waveform of a signal outputted from the VCO is 50%. Then, if the duty value of the waveform of the output signal deviates from 50%, times when the signal waveforms of the normal turn signal FOUT and the inverted signal/FOUT of the output signal from the VCO are of high level differ.

For the reason, a potential difference occurs between the output signals from the integrators 24 and 25 to which these signals are inputted.

Because the output of the subtractor 26 is this potential difference, the output of this subtractor 26 is shifted from an intermediate potential to power voltage side or to grounding potential side. Therefore, by measuring how much the output voltage of the subtractor 26 is shifted from the intermediate potential, how the duty value deviates from 50% can be estimated.

According to this embodiment, by loading the test circuit for outputting a differential voltage of integrated voltage gained by integrating the normal turn signal FOUT of the output signal of the VCO and the inverted signal/FOUT each on an integrated circuit containing the PLL circuit and then only measuring the differential voltage, it can be detected that the duty value of the output signal of the PLL circuit deviates from 50% easily and at cheap cost, thereby contributing to selecting whether a LSI chip is good or wrong.

Figure 9:
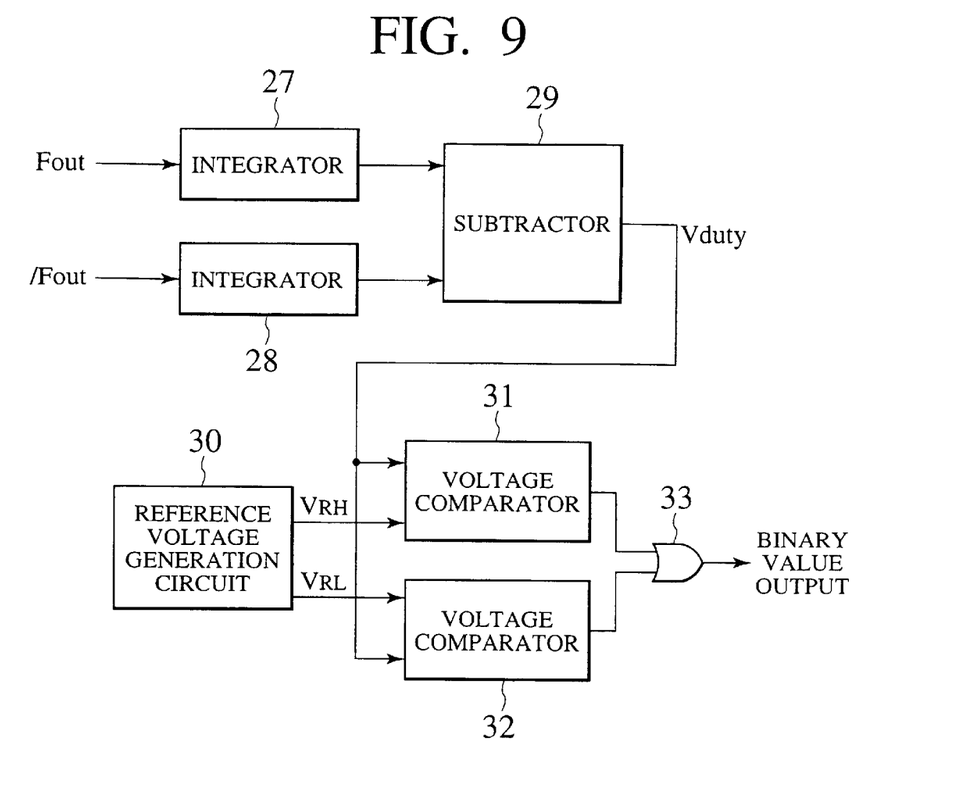
FIG. 9 is a block diagram showing a structure of the second embodiment of a test circuit for measuring basic duty values loaded on the integrated circuit of the present invention.

FIG. 9 is a block diagram showing the structure of the second embodiment of a test circuit for measuring a basic duty value loaded on the integrated circuit of the present invention.

The test circuit of this embodiment comprises an integrator 27 for integrating the normal turn signal FOUT of the output signal of the PLL circuit, an integrator 28 for integrating the inverted signal/FOUT of the output signal, a subtractor 29 for obtaining a differential between the integrated values by the integrators 27, 28, a reference voltage generation circuit 30 for generating a reference voltage (VRH) higher than a predetermined intermediate potential and a reference voltage (VRL) lower than a predetermined intermediate potential, a voltage comparator 31 for comparing the differential voltage outputted from the subtractor 29 with the higher reference voltage (VRH), a voltage comparator 32 for comparing the differential voltage outputted from the subtractor 29 with the lower reference voltage (VRL), and an OR circuit 33 for implementing logical OR of the outputs from the voltage comparators 31, 32.

An operation of the test circuit of this embodiment will be described.

The integrators 27, 28 receive the normal turn signal Fout and the inverted signal/Fout of the output signal from the PLL circuit and integrates them respectively. The obtained integrated voltages are outputted to the subtractor 29. The subtractor 29 obtains a differential between the inputted integrated voltages and outputs the obtained differential voltage Vduty to the voltage comparators 31, 32.

The voltage comparator 31 compares the inputted differential voltage with the reference voltage (VRH) higher than the predetermined intermediate potential and its result is outputted through the OR circuit 33. The voltage comparator 32 compares the inputted differential voltage with the reference voltage (VRL) lower than the predetermined intermediate potential and outputs its result through the OR circuit 33.

Here, when the output of the subtractor 29 is higher than the reference voltage (VRH), the voltage comparator 31 for comparing the potential differential between the output of the subtractor 29 and the higher reference voltage (VRH), it outputs a high level signal. Conversely, when the output of the subtractor 29 is lower than the reference voltage (VRH), a low level signal is outputted. Then, when the output of the subtractor 29 is lower than the reference voltage (VRL), the voltage comparator 32 for comparing the potential differential between the output of the subtractor 29 and the reference voltage (VRL), a high level signal is outputted. Conversely, when higher, a low level signal is outputted.

Therefore, when the duty value is 50%, the output of the substractor 29 is at the intermediate potential. Thus, the two subtractors 31, 32 output low level binary signals. Further, the OR circuit 33 for receiving the outputs of the two voltage comparators 31, 32 outputs a low level signal.

Then, because the output of the subtractor 29 deviates from the intermediate potential when the duty value deviates from 50%, it becomes higher than the high reference voltage (VRH) or lower than the low reference voltage (VRL). Consequently, any one of the two voltage comparators 31, 32 outputs a high-level binary signal. Further, the OR circuit 33 for receiving the output of the two voltage comparators 31, 32 outputs a high-level binary signal.

For this reason, by measuring whether the output of the OR circuit 33 is of low level or high level, it is determined whether the deviation of the duty value of the PLL circuit from 50% is large or small. That is, it is possible to determined whether an integrated circuit containing the PLL circuit and this test circuit is good or bad easily.

According to this embodiment whether the PLL circuit loaded on the integrated circuit is good or bad can be indicated with binary output and it is possible to detect a lot whose deviation of the duty value from 50% is large easily and quickly without the necessity of an external measuring device.

Further, by incorporating a test circuit for measuring the jitter value of the PLL circuit on the LSI chip, the measuring time can be reduced and the necessity of an expensive measuring device is eliminated, although the chip cost increases to some extent due to an additional circuit, so that the test cost can be reduced largely.

Figure 10:
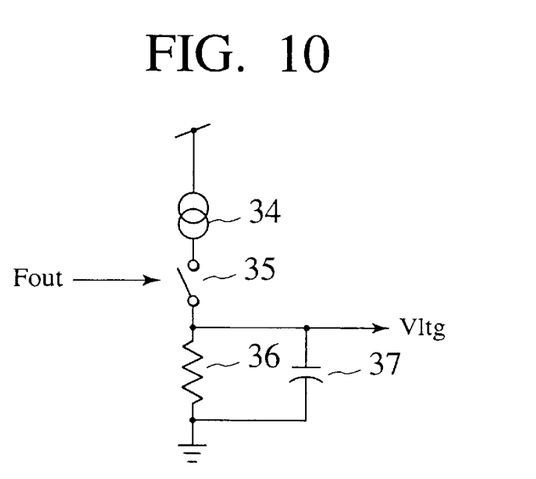
FIG. 10 is a circuit diagram showing the structure of the first embodiment of the integrator for use in the circuits shown in FIGS. 8, 9.

FIG. 10 is a circuit diagram showing the structure of the first embodiment of the integrator for use in the circuit shown in FIGS. 8, 9.

The integrator comprises a constant current source 34 in which a terminal thereof is connected to the power voltage, an accumulation switch circuit 35 placed between the constant current source 34 and an output terminal and controlled by the normal turn signal FOUT of the output signal of the VCO and the inverted signal/FOUT, a resistive element 36 for discharging connected between the output terminal and the grounding potential and a capacitive element 37 connected between the output terminal and the grounding potential.

Figure 11:
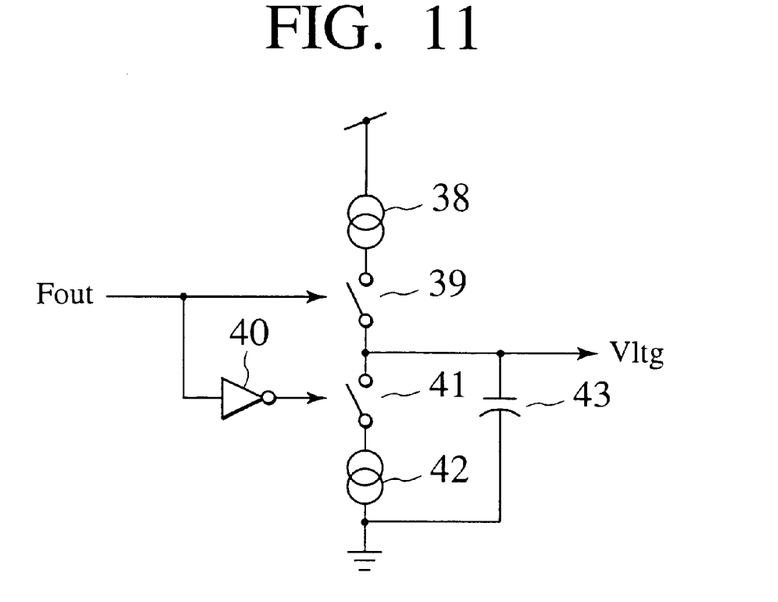
FIG. 11 is a circuit diagram showing the structure of the second embodiment of the integrator for use in the circuits shown in FIGS. 8, 9.

FIG. 11 is a circuit diagram showing the structure of the second embodiment of the integrator for use in the circuit shown in FIGS. 8, 9.

This integrator comprises a constant current source 38 in which a terminal thereof is connected to the power voltage, an accumulation switch circuit 39 placed between the constant current source 38 and the output terminal and controlled by the normal turn signal FOUT or the inverted signal/FOUT of the output signal of the VCO, an inverter circuit 40 for inverting a control signal for controlling the accumulation switch circuit 39, a constant current source 42 in which a terminal thereof is connected to the grounding potential, a discharge switch circuit 41 placed between the constant current source 42 and the output terminal and controlled by an inverted signal of the control signal for controlling the accumulation switch circuit 39 and a capacitive element 43 connected between the output terminal and grounding potential.

If the accumulation switch circuit 39 is comprised of PMOS transistor and the discharge switch circuit 41 is comprised of NMOS transistor, the accumulation switch circuit 39 and the discharge switch circuit 41 can be controlled by the same control signal because those transistors have different polarities. Thus, the inverter circuit 40 for inverting the control signal shown in FIG. 10 is not necessary.

Figure 12:
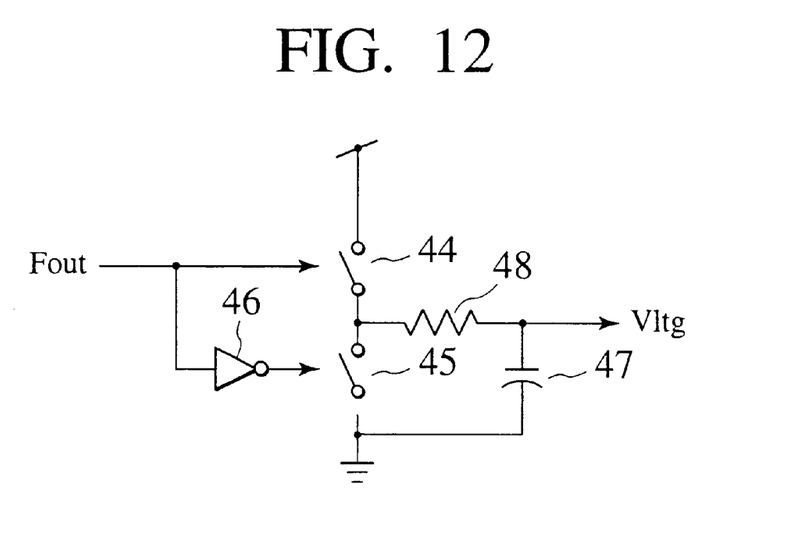
FIG. 12 is a circuit diagram showing the structure of the third embodiment of the integrator for use in the circuits shown in FIGS. 8, 9.

FIG. 12 is a circuit diagram showing the structure of a third embodiment of the integrator for use in the circuit shown in FIGS. 8, 9.

This integrator is controlled by the normal turn signal FOUT and the inverted signal/FOUT of the output signal of the VCO, and comprises an accumulation switch circuit 44 in which a terminal thereof is connected to the power voltage, an inverter circuit 46 for inverting a control signal for controlling the accumulation switch circuit 44, a discharge switch circuit 45 controlled by the inverted signal of the control signal for controlling the accumulation switch circuit 44, in which a terminal thereof is connected to the grounding potential while the other terminal thereof is connected to the accumulation switch circuit 44, a resistive element 48 connected between common joint terminal and output terminal of the accumulation switch circuit 44 and the discharge switch circuit 45 and a capacitive element 47 connected between the output terminal and grounding potential.

If the accumulation switch circuit 44 is comprised of PMOS transistor and the discharge switch circuit 45 is comprised of NMOS transistor, the accumulation switch circuit 44 and the discharge switch circuit 45 can be controlled by the same control signal because those transistors have different polarities. Thus, the inverter circuit 46 for inverting the control signal shown in FIG. 11 is not necessary.

Figure 13:
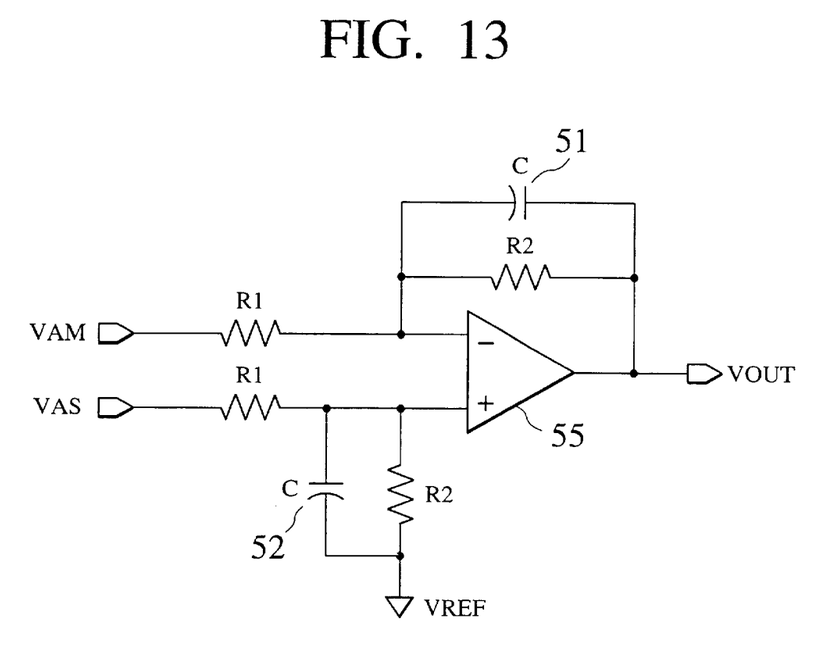
FIG. 13 is a circuit diagram showing the structure of an embodiment of a subtractor for use in the circuits shown in FIGS. 8, 9.

FIG. 13 is a circuit diagram showing an embodiment of a subtractor for use in the circuit shown in FIGS. 8, 9. The subtractor comprises an input resistive element R1, two feedback resistive elements R2, an operational amplifier 55 and capacitive elements 51, 52 placed in parallel to each feedback resistive element R2. Because amplification factor of the subtractor 55 can be adjusted by R2/R1, which is a ratio between the resistive elements R1 and R2, the amount of change of the output voltage of the subtractor 55 with respect to the duty value of the PLL circuit, that is, the sensitivity is variable.

The capacitive element 51 placed in parallel to the feedback resistive element R2 removes harmonic noise component from the output of the subtractor 55. The capacitive element 52 placed in parallel to another feedback resistive element R2 removes noise component from the input so as to stabilize its potential. A differential of the voltages inputted from the terminals VAM, VAS is outputted from a terminal VOUT.

Figure 14:
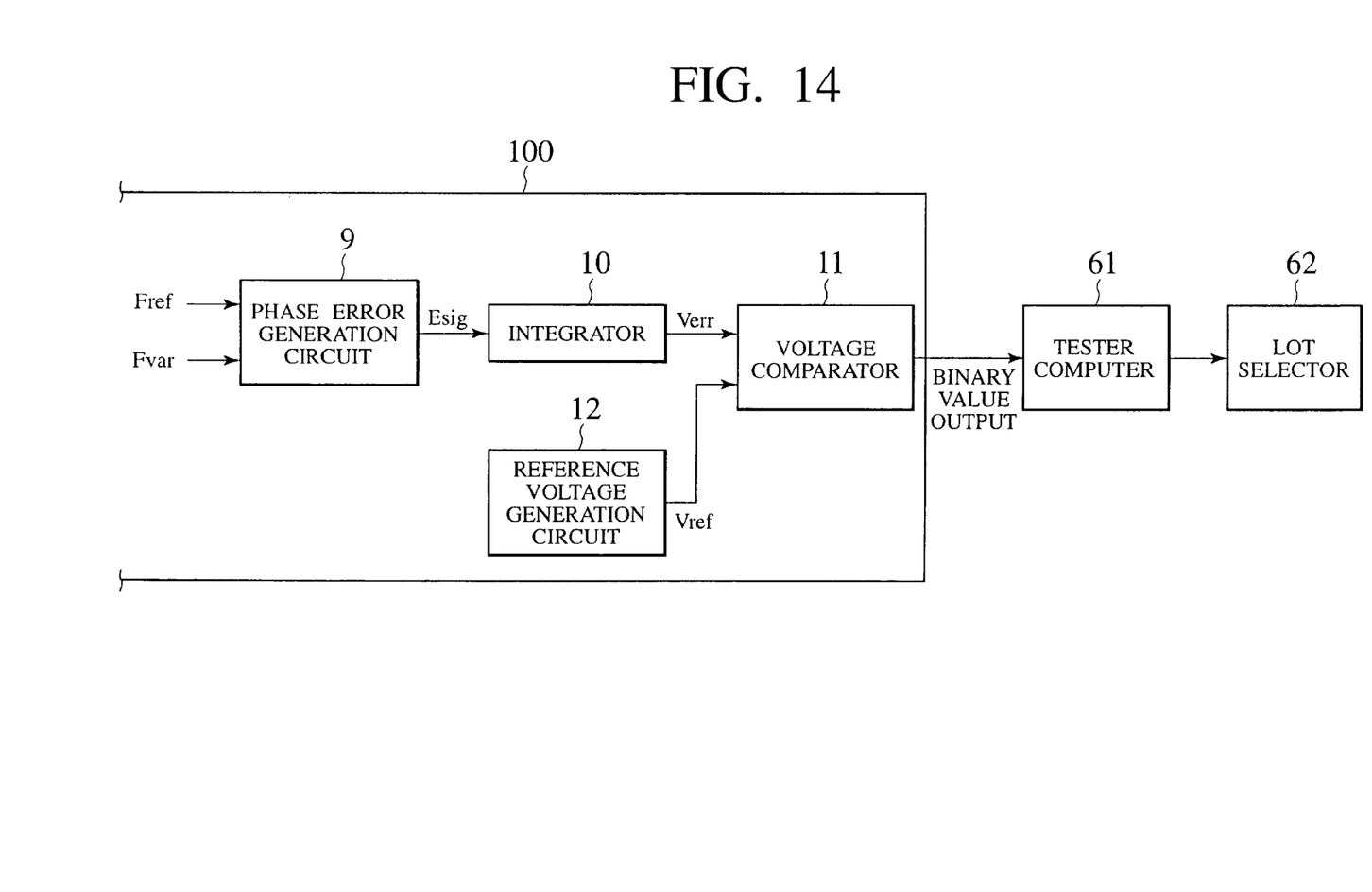
FIG. 14 is a block diagram showing the structure of the first embodiment of a lot selection system of the present invention.

FIG. 14 is a block diagram showing the structure of the first embodiment of the lot selection system of the present invention.

The lot selection system of this embodiment receives the reference signal Fref from the PLL circuit (not shown) loaded on the integrated circuit which is an objective for selection and the signal Fvar gained by dividing the output frequency of the VCO as input. This lot selection system comprises the phase error generating circuit 9 for generating the phase error signal Esig from the phase error between the both, the integrator 10 for integrating the generated phase error signal Esig so as to generate the integrated voltage Verr of the phase error, a voltage comparator 11 for receiving the integrated voltage Verr of the phase error and the reference voltage Vref so as to compare the magnitudes of the voltages of the both, the reference voltage generating circuit 12 for generating the reference voltage Vref and supplying it to the voltage comparator 11, a tester 61 comprised of a computer for testing the integrated circuit which is an objective for selection, and a lot selector 62 for selecting lots (integrated circuit) according to a control signal from the tester 61. Here, the phase error generation circuit 9, the integrator 10, the voltage comparator 11 and the reference voltage generating circuit 12 compose the test circuit for testing the jitter and is loaded on an integrated circuit 100 which is an objective for selection. If a tester 61 turns the integrated circuit (LSI chip) 100 of production line to test mode and tests the jitter value of a PLL circuit loaded thereon, its result is outputted from the test circuit in the form of binary signal and inputted to a tester 61. If the binary output is high level indicating a product, the tester 61 outputs a control signal for removing that given integrated circuit 100 to the lot selector 62. If the binary output is low level indicating a good product, the tester 61 outputs a control signal for shipping that integrated circuit 100 to the lot selector 62. Consequently, the lot selector 62 removes the bad product and ships only the good product so as to select the integrated circuits.

That is, the lot selection system of this embodiment contains the test circuit for determining whether a product is good or bad by measuring the jitter value of the PLL circuit. Thus, an automatic selection system for selecting good products and wrong products depending on the magnitude of the jitter value can be built with a very simple structure, thereby making it possible to improve productivity and quality control of the integrated circuit tremendously.

Figure 15:
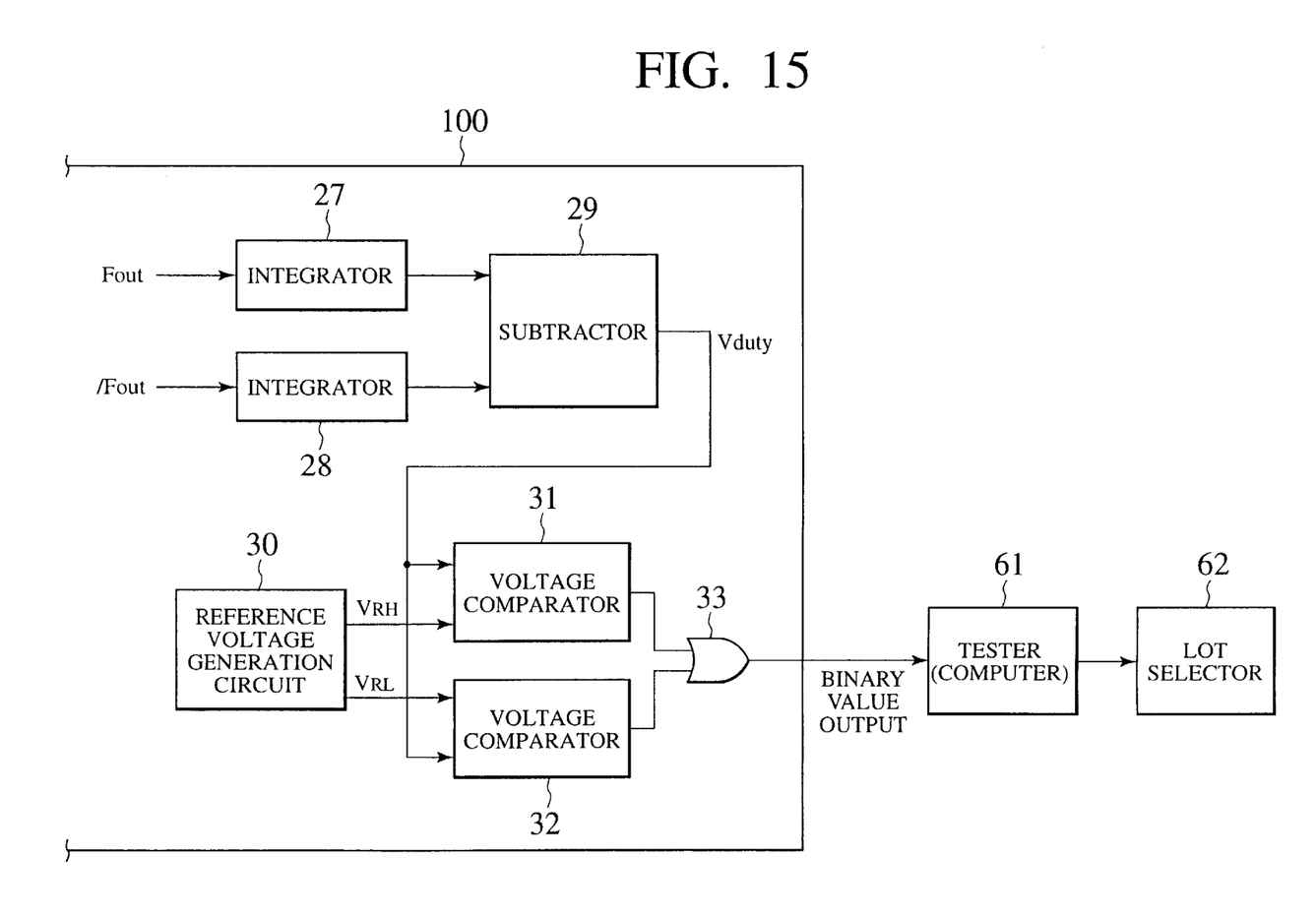
FIG. 15 is a block diagram showing the structure of the second embodiment of a lot selection system of the present invention.

Meanwhile, an automatic selection system for automatically selecting the integrated circuits, incorporating a circuit for detecting an error in the duty value of the PLL circuit shown in FIG. 9 can be built as shown in FIG. 15, so that the same operation and effect are achieved.

OTHER EMBODIENTS

Various modifications will become possible for those skilled in the art after receiving the teachings of the present disclosure without depending from the scope thereof.

What is claimed is:

1. An integrated circuit comprising a unit for generating an integrated voltage corresponding to a phase error between a reference voltage of a PLL circuit and a dividing signal so as to compare the generated integrated voltage with said reference voltage, wherein the unit is electrically outside of a loop of the PLL circuit.

2. An integrated circuit for testing a PLL circuit comprising:
   a phase error generator configured to receive a signal gained by dividing an oscillated signal from a voltage controlled oscillator and a reference signal so as to detect a phase error signal between the both;
   an integrating circuit configured to integrate error signals outputted by said phase error generation circuit;
   a reference voltage generator configured to generate a predetermined reference voltage; and
   a comparator configured to compare an integration result voltage outputted from said integrating circuit with a reference voltage generated by said reference voltage generation circuit;
   wherein said reference voltage generator and said comparator are configured electrically outside of a loop in the PLL circuit.

3. The integrated circuit according to claim 2, wherein said phase error generator comprises:
   a phase comparator configured to receive the signal gained by dividing the oscillated signal from the voltage control controlled oscillator and the reference signal to compare the signals, the phase comparator configured to output a DOWN signal and an UP signal based on a result of the comparison; and
   a logical OR circuit configured to receive the DOWN signal and the UP signal generated by the phase comparator used in the PLL circuit so as to gain logical OR of the both signals, the logical OR circuit being configured electrically outside of a loop of the PLL circuit.

4. The integrated circuit according to claim 2, wherein said phase error generator comprises:
   a first dividing circuit configured to divide the signal gained by dividing an the oscillated signal from the voltage controlled oscillator;
   a second dividing circuit configured to receive the reference signal to divide the reference signal; and
   an exclusive logical OR circuit configured to implement a signal of exclusive logical OR of dividing signals outputted from said first- and second dividing circuits.

5. An integrated circuit comprising:
   a first integrator configured to receive a normal turn signal of an oscillated signal from a voltage controlled oscillator and to integrate the normal turn signal;
   a second integrator configured to receive an inverted signal of said oscillated signal and to integrate the inverted signal;
   subtracter configured to receive the integrated the normal turn signal and the inverted signal to obtain a difference between the received signals.

6. An integrated circuit comprising:
   a first integrator configured to receive a normal turn signal of an oscillated signal from a voltage controlled oscillator and integrating it;
   a second integrator configured to receive an inverted signal of said oscillated signal and integrating it;
   a subtracter configured to obtain a differential between integration result voltages outputted from said first and second integrating circuits;
   a reference voltage generator configured to generate a reference voltage higher and a reference voltage lower than a predetermined intermediate voltage;
   a first voltage comparator configured to compare a differential voltage outputted from said subtraction circuit with a higher reference voltage generated by said reference voltage generation circuit;
   a second voltage comparator configured to compare a differential voltage outputted from said subtraction circuit with a lower reference voltage generated by said reference voltage generation circuit; and
   a logical OR circuit configured to implement logical OR of comparison results outputted from said first and second voltage comparison circuits.

7. A lot selection system comprising:
   a unit for generating an integrated voltage corresponding to a phase error between a reference signal of a PLL circuit and a dividing signal so as to compare the generated integrated voltage with the reference voltage,
   wherein whether a LSI chip is good or bad is determined depending on a comparison result so as to select a LSI chip, and
   the unit is electrically outside of a loop of the PLL circuit.

8. A lot selection system for testing a PLL circuit in an LSI chip, the system comprising:
   a phase error generator incorporated into the LSI chip, the phase error generator configured to receive a signal gained by dividing an oscillated signal from a voltage controlled oscillator and a reference signal so as to detect a phase error signal between the both;
   an integrator incorporated into the LSI chip, the integrator configured to integrate error signals outputted by said phase error generation circuit;
   a reference voltage generator incorporated into the LSI chip, the voltage comparator configured to generate a predetermined reference voltage;
   a voltage comparator incorporated into the LSI chip configured to compare an integration result voltage outputted from said integrating circuit with a reference voltage generated by said reference voltage generation circuit;
   a determining circuit configured such that it can be coupled to the LSI chip, the determining circuit configured to determine whether a LSI chip containing said respective circuits is good or bad depending on a comparison result outputted from said voltage comparison circuit; and
   a lot selector configured such that it can be coupled to the LSI chip, the lot selector configured to select said LSI chip depending on a determination result of said determining circuit,
   wherein said reference voltage generator and said voltage comparator are configured electrically outside of a loop in the PLL circuit.

9. A lot selection system comprising:
   a first integrator configured to receive a normal turn signal of an oscillated signal from a voltage controlled oscillator and integrating it;
   a second integrator configured to receive an inverted signal of said oscillated signal and integrating it;
   a subtracter configured to obtain a differential between integration result voltages outputted from said first and second integrating circuits;
   a reference voltage generator configured to generate a reference voltage higher and a reference voltage lower than a predetermined intermediate voltage;

a first voltage comparator configured to compare a differential voltage outputted from said subtraction circuit with a higher reference voltage generated by said reference voltage generation circuit;

a second voltage comparator configured to compare a differential voltage outputted from said subtraction circuit with a lower reference voltage generated by said reference voltage generation circuit; and a logical OR circuit configured to implement logical OR of comparison results outputted from said first and second voltage comparison circuits;

a determining circuit configured such that it can be coupled to the LSI chip, the determining circuit configured to determine whether a LSI chip containing said respective circuits is good or bad depending on a comparison result outputted from said logical OR circuit; and a lot selector configured such that it can be coupled to the LSI chip, the lot selector configured to select said LSI chip depending on a determination result of said determining circuit.

* * * * *